United States Patent [19]

Lauffer

[11] 4,092,550
[45] May 30, 1978

[54] FREQUENCY MULTIPLIER AND LEVEL DETECTOR

[75] Inventor: Donald K. Lauffer, Poway, Calif.

[73] Assignee: NCR Corporation, Dayton, Ohio

[21] Appl. No.: 744,204

[22] Filed: Nov. 22, 1976

[51] Int. Cl.² .......................... H03K 3/78; H03K 3/26; H03B 19/14; H03K 17/30

[52] U.S. Cl. ................................ 307/229; 307/225 R; 307/261; 307/360; 328/13; 328/135; 328/150

[58] Field of Search ............ 307/220 R, 224 R, 225 R, 307/229, 261, 350, 360, 361; 328/13, 28, 38, 75, 142, 150, 135

[56] References Cited

U.S. PATENT DOCUMENTS

| | | | |
|---|---|---|---|
| 3,535,549 | 10/1970 | Herrero | 328/142 X |
| 3,539,831 | 11/1970 | Gilbert | 307/361 |
| 3,743,946 | 7/1973 | Gass et al. | 328/38 X |

*Primary Examiner*—Larry N. Anagnos

*Attorney, Agent, or Firm*—J. T. Cavender; Albert L. Sessler, Jr.; Elmer Wargo

[57] ABSTRACT

A frequency multiplier and level detector circuit is disclosed and includes a plurality of switching devices with the first one of said switching devices and the remaining one or ones thereof being interconnected in successive stages, and being switchable between first and second states in response to predetermined values of an input pulse. The switching devices each have a thresholding network associated therewith, and the switching devices are interconnected so that when the second or any subsequent ones of the switching devices is switched into the first state in response to the input pulse, it causes the preceding stage of the switching device to switch to the second state, thereby producing a number of output pulses at the first stage of the switching devices, which number of output pulses is dependent upon the number of the switching devices which have been switched into the first state.

17 Claims, 8 Drawing Figures

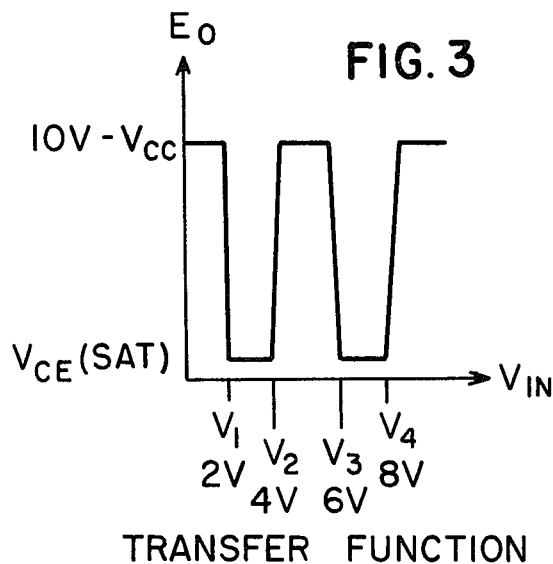
FIG. 3 TRANSFER FUNCTION
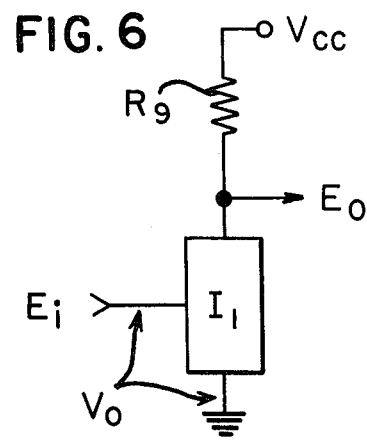
FIG. 6
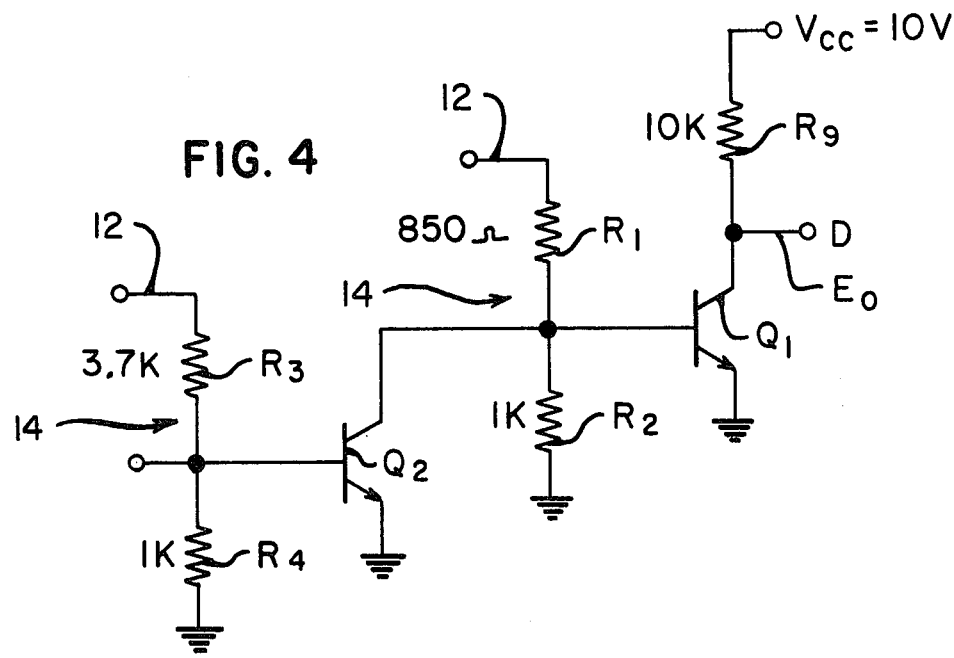
FIG. 4
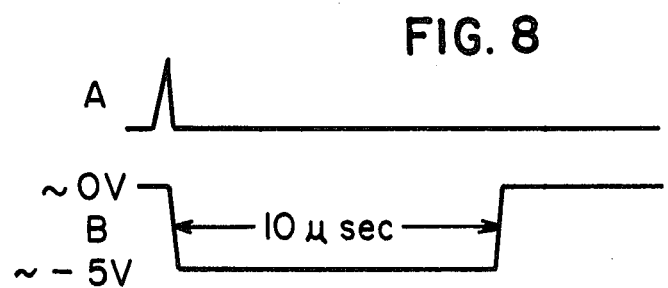
FIG. 8

INPUT CONDITIONING CIRCUIT

FREQUENCY MULTIPLIER AND LEVEL DETECTOR

BACKGROUND OF THE INVENTION

This invention relates to a frequency multiplier and level detector circuit.

The circuit of this invention has many applications in EDP equipment, the automotive industry, digital communications, test instrumentation, and situations requiring an analog to digital converter.

For example, when the circuit of this invention is used as a level detector circuit, it can be used as a voltage level discriminator in a test instrument, such as a multimeter, to automatically select the proper voltage range for the instrument when testing an unknown voltage. In general, this circuit can be used to discriminate analog voltage levels and to convert these levels to digital pulse information which is useful for digital manipulation, as for example in EDP majority logic circuitry.

When the circuit of this invention is used as a frequency multiplier, the circuit will multiply input pulses by a factor determined by the number of stages in the circuit and/or the input pulse voltage amplitude. For example, if the number of stages in the circuit is N, there will be N pulses generated at the output of the circuit for each input pulse. In EDP and communications type networks, this circuit could perform arithmetic in conjunction with currently available digital counters or other circuit logic.

Some prior art disclosures which relate to frequency multiplier circuits and circuits having plural amplitude responsive stages are shown in the following U.S. patents and publications:

U.S. Pat. No. 2,486,390
U.S. Pat. No. 3,097,309
U.S. Pat. No. 3,535,549
U.S. Pat. No. 3,539,831 and
U.S. Pat. No. 3,743,946; and
Beisner: Analog to Digital Conversion Device, IBM Technical Disclosure Bulletin, Volume 7, No. 11, April 1965, pgs. 1054–1055.

None of these disclosures shows a frequency multiplier and level detector circuit which is amplitude responsive and in which the output from the circuit alternately takes on one of two values as the input to the circuit increases monotonically.

SUMMARY OF THE INVENTION

This invention relates to a circuit which includes a plurality of circuit means or switching means which are switchable between first and second states, with the first one and the remaining one or ones of said plurality being interconnected in successive stages and with means for supplying an input pulse to each of the switching means to enable each of the switching means to switch to the first state (or to assume the first state) in response to predetermined values of the input pulse. There are also means interconnecting the switching means so that when the second or any subsequent one of the switching means in the successive stages is switched to the first state in response to the input pulse, the second or any subsequent one of the switching means causes the preceding switching means to switch to the second state, thereby producing a number of pulses at the first one of the switching means. The number of output pulses is dependent upon the number of the switching means which have been switched into the first state in response to the input pulse.

BRIEF DESCRIPTION OF THE DRAWINGS

FIG. 3 is a graphical representation of the circuit transfer function for the circuit shown in FIG. 1;

FIG. 4 is a general schematic diagram of a portion of the circuit shown in FIG. 1 whose resistive elements are rearranged to emphasize certain features of the circuit;

FIG. 6 is a view of the first stage of the circuit shown in FIG. 5 to show the associated threshold offset;

FIG. 8 is a graphical representation of the various waveforms associated with the circuit shown in FIG. 7.

DETAILED DESCRIPTION OF THE INVENTION

Figure 1:
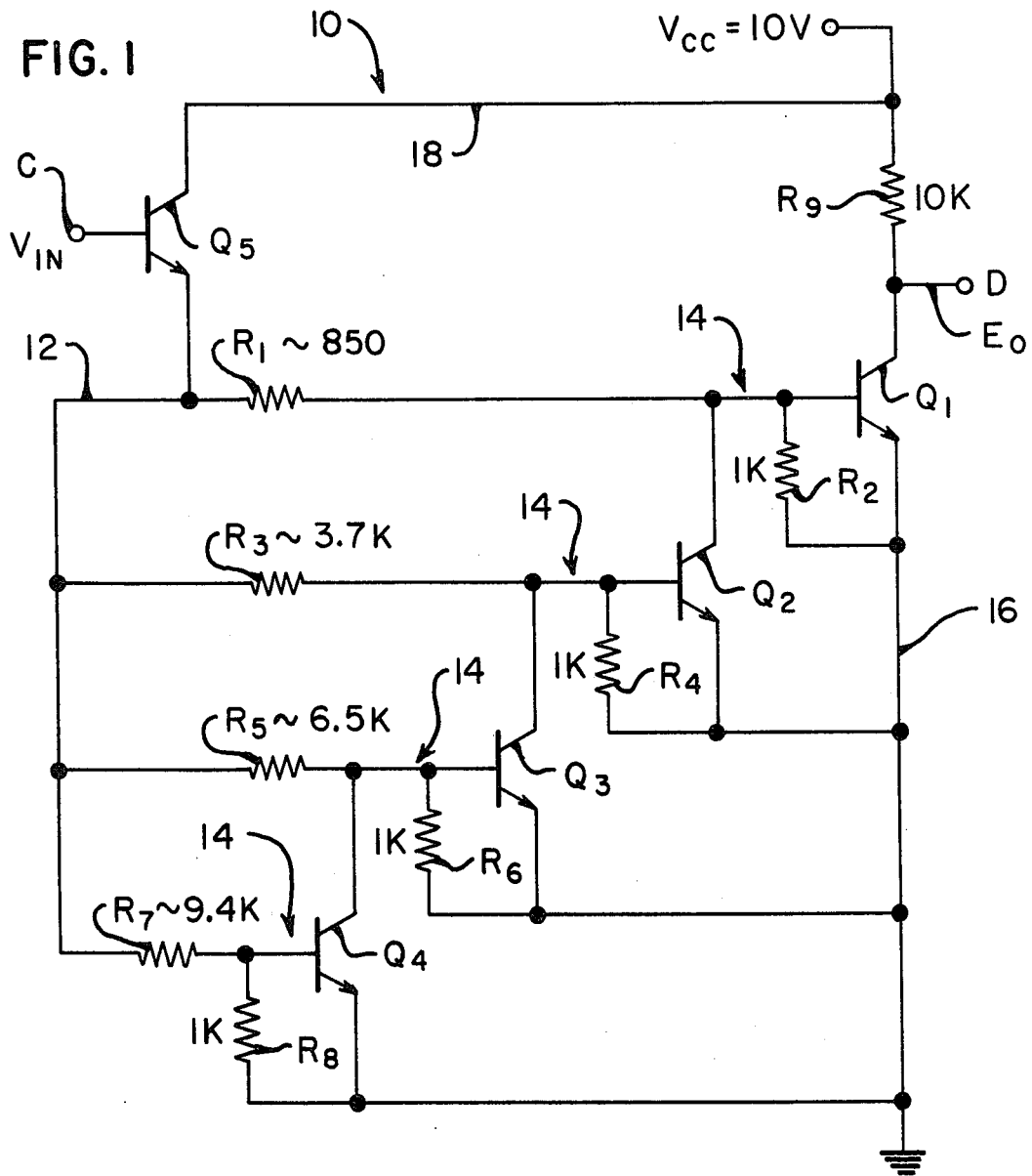
FIG. 1 is a general schematic diagram of a first embodiment of a frequency multiplier and level detector circuit which embodies the principles of this invention and which uses transistors for switching means.

FIG. 1 is a general schematic diagram of a first embodiment of a frequency multiplier and level detector circuit of this invention and is designated generally as 10.

The circuit 10 (FIG. 1) includes a plurality of circuit means, switching means, or inverting means (hereinafter called switching means $Q_1$, $Q_2$, $Q_3$ and $Q_4$,) which in the embodiment shown, are transistors, with the first one ($Q_1$) of said plurality and the remaining ones $Q_2$, $Q_3$ and $Q_4$ being interconnected in successive stages. A common conductor 12 is used to supply an input pulse or voltage to each of the switching means $Q_1$, $Q_2$, $Q_3$ and $Q_4$ via thresholding means 14 for each of the switching means.

The thresholding means 14 for switching means $Q_1$, for example, includes a first resistor $R_1$ which is connected between the common conductor 12 and the base of transistor $Q_1$, and a second resistor $R_2$ which is connected between the base of transistor $Q_1$ and a common ground 16. Similarly, the thresholding means 14 for transistor $Q_2$ includes a first resistor $R_3$ which is connected between the common conductor 12 and the base of transistor $Q_2$ and a second resistor $R_4$ which is connected between the base of transistor $Q_2$ and the common ground 16. The thresholding means 14 for transistor $Q_3$ includes a first resistor $R_5$ and a second resistor $R_6$ and the thresholding means for transistor $Q_4$ includes a first resistor $R_7$ and a second resistor $R_8$, which said resistors are connected to their associated transistors $Q_3$ and $Q_4$ in a manner which is identical to that employed with the transistors $Q_1$ and $Q_2$. The emitters of each of the transistors $Q_1$, $Q_2$, $Q_3$ and $Q_4$ are connected to the common ground 16.

The first switching means, transistor $Q_1$ (FIG. 1) has its collector series connected with a resistor $R_9$ which is connected to an energizing source of potential $V_{cc}$. The output $E_o$ of the circuit 10 includes a terminal D which is connected to the collector of transistor $Q_1$. The collector of $Q_2$ is connected to the base of the preceding transistor $Q_1$, and similarly, the collector of transistor $Q_3$ is connected to the base of transistor $Q_2$, and the collector of transistor $Q_4$ is connected to the base of the transistor $Q_3$.

An input pulse to the circuit 10 is provided at terminal C ($V_{in}$) which is connected to the base of a transistor $Q_5$ whose emitter is connected to the common conductor 12 and whose collector is connected to the energizing source of potential $V_{cc}$ by a conductor 18. The function of the transistor $Q_5$ is simply to isolate the input to the circuit 10 and to act as a current amplifier. As an illustration of the resistive components used in the circuit 10, the following values may be used:

$R_1$ = 850 ohms
$R_2$ = 1K ohms
$R_3$ = 3.7K ohms
$R_4$ = 1K ohms
$R_5$ = 6.5K ohms
$R_6$ = 1K ohms
$R_7$ = 9.4K ohms
$R_8$ = 1K ohms, and
$R_9$ = 10K ohms.

The switching means or transistor $Q_1$, $Q_2$, $Q_3$, $Q_4$ and $Q_5$ are all NPN transistors, like type 2N2369, for example, in the illustrated embodiment. The source of potential $V_{cc}$ for the embodiment shown is 10 volts.

Figure 2:
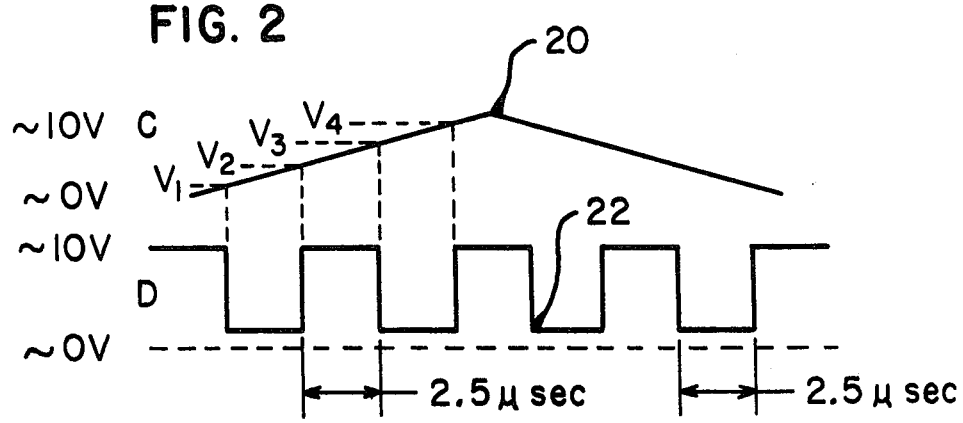
FIG. 2 is a graphical representation of various waveforms of the circuit shown in FIG. 1.

The operation of the circuit 10 shown in FIG. 1 will now be explained in conjunction with waveforms shown in FIG. 2 and the circuit transfer function shown in FIG. 3. For an input voltage $V_{in}$ of zero volts at terminal C, all the transistors $Q_1$, $Q_2$, $Q_3$ and $Q_4$ are in the "off" or second state condition; therefore, the output ($E_o$) of the circuit at D is approximately equal to $V_{cc}$ or 10 volts. As the input pulse from $V_{in}$ approaches a voltage $V_1$ (where $V_1$ is determined by the ratio of $R_1$ to $R_2$), transistor $Q_1$ is turned on into saturation (or switched to a first state) causing the output voltage $E_o$ at terminal D to drop to approximately zero volts as shown in FIGS. 2 and 3. The values of the various resistors like $R_1$, $R_2$ etc. for the thresholding means 14 associated with each of the transistors $Q_1$–$Q_4$ were selected so that transistor $Q_1$ conducts at $V_{in}$ equal to $V_1$ or 2 volts; transistor $Q_2$ conducts at $V_{in}$ equal to $V_2$ or 4 volts; transistor $Q_3$ conducts at $V_{in}$ equal to $V_3$ or 6 volts; and transistor $Q_4$ conducts at $V_{in}$ equal to $V_4$ or 8 volts. As $V_{in}$ approaches $V_2$ (which is determined by the ratio of resistors by $R_3$ and $R_4$), transistor $Q_2$ conducts and robs the base current from transistor $Q_1$ causing transistor $Q_1$ to turn off; the output voltage ($E_o$) of the circuit 10 then rises to $V_{cc}$ or 10 volts. As $V_{in}$ approaches $V_3$ (which is determined by the ratio of resistors $R_5$ and $R_6$), transistor $Q_3$ conducts and thereby robs the base current from transistor $Q_2$, turning transistor $Q_2$ off. When transistor $Q_2$ is turned off, transistor $Q_1$ is turned on again, thereby causing the output voltage $E_o$ of the circuit 10 to drop to approximately zero volts as shown in FIGS. 2 and 3. As $V_{in}$ approaches $V_4$ (which is determined by the ratio of resistors $R_7$ and $R_8$), transistor $Q_4$ is turned on, thereby turning off transistor $Q_3$, which in succession causes transistor $Q_2$ to turn on and transistor $Q_1$ to turn off, resulting in the output voltage $E_o$ rising to $V_{cc}$ or 10 volts. What has been described so far relates to a rise in voltage $V_{in}$ from 0 to the peak voltage indicated by point 20 as shown in graph C of FIG. 2.

As the input voltage $V_{in}$ drops from its peak shown by point 20 in FIG. 2 to a level below $V_4$, transistor $Q_4$ is turned off, and due to the fact that $V_{in}$ is now less than $V_4$ but greater than $V_3$, transistor $Q_3$ will be turned on, causing, in succession, transistor $Q_2$ to turn off and transistor $Q_1$ to turn on. When transistor $Q_1$ turns on, the output voltage $E_o$ from the circuit 10 at terminal D drops to approximately zero volts as shown as point 22 on graph D in FIG. 2. As the input voltage $V_{in}$ for the input pulse drops even further, the same succession of pulses is generated for the fall of voltage $V_{in}$ as was generated during the rise of voltage of the input pulse $V_{in}$ at point C (FIG. 1). It is apparent from the foregoing that for one positive transition of the input pulse with $V_{in}$ rising from zero volts to point 20 of FIG. 2, two output pulses are generated at the output of the circuit 10 at terminal D, and as the input pulse is again returned to zero, two output pulses are also generated at terminal D for the embodiment shown. Therefore, for one input pulse $V_{in}$, four output pulses are generated at the terminal D. Each transistor like $Q_1$ and its associated resistors like $R_1$, $R_2$ is considered a stage.

It follows then, that the multiplication factor of the circuit 10 (FIG. 1) when used as a frequency multiplier circuit is equal to the number of stages (N) employed in the circuit 10. It is apparent that the principles of this invention may be utilized to construct a circuit 10 with more or less stages than are shown in the illustrative embodiment of FIG. 1.

When the circuit 10 (FIG. 1) is used as a voltage level detector, the number of stages of the switching or inverting means (like transistors $Q_1$, $Q_2$) which have been switched to the first state (on conduction state), as determined by the number of pulses generated at the output terminal D, can be used as a measure of the voltage level biasing fed to the circuit 10. For example, if the input voltage to the circuit 10 is raised to $0 < V_{in} < V_1$, no output at terminal D will result. If the input voltage is raised to $V_1 < V_{in} < V_2$, one transition will result at terminal D. If the input voltage is raised to $V_2 < V_{in} < V_3$, two transitions will result at the terminal D, etc. The output from the circuit 10 can, for example, be used in a multimeter to automatically select the appropriate range for the multimeter, or it can be used in EDP majority logic circuitry.

The threshold voltages $V_1$, $V_2$, $V_3$ and $V_4$ (FIG. 2) are determined by the following equation:

$$V_{1-4} = V_o \left[ \frac{R_1}{R_2} + 1 \right] + V_{BE_5} \qquad \text{Equation \#1:}$$

$V_o$ = the base emitter junction voltage of the transistor like $Q_1$, $Q_2$, $Q_3$, $Q_4$, etc., used.

$V_{BE_5}$ = the base emitter junction voltage of the transistor $Q_5$.

The term $V_{ce}$ Sat in FIG. 3 represents the voltage drop between the collector and emitter during saturation of the transistor.

FIG. 4 is a portion of the circuit 10 shown in FIG. 1 and is identical to that portion; however, the resistors like $R_1$, $R_2$ are rearranged differently to emphasize certain features. For example, the resistors $R_1$, $R_2$ form a voltage divider network for the associated transistor $Q_1$. It is interesting to note that the threshold voltages like $V_1$, $V_2$, $V_3$ and $V_4$ are merely a function of the resistor ratios (like $R_1/R_2$) as opposed to the actual resistance values, and this feature makes the circuit 10 exceptionally suitable for integrated circuit fabrications. The fact that there are no inductive components required in the circuit 10, also makes it suitable for integrated circuit fabrications.

The frequency multiplier and level detector circuit 10 shown in FIG. 1 can be used as either a frequency multiplier or a level detector circuit. In some situations it may be desirable to slow up the rise and fall times of the input pulse $V_{in}$ associated with the circuit 10, when the circuit 10 is used as a pulse multiplier. A suitable input conditioning circuit 24 for this purpose is shown in FIG. 7.

Figure 7:
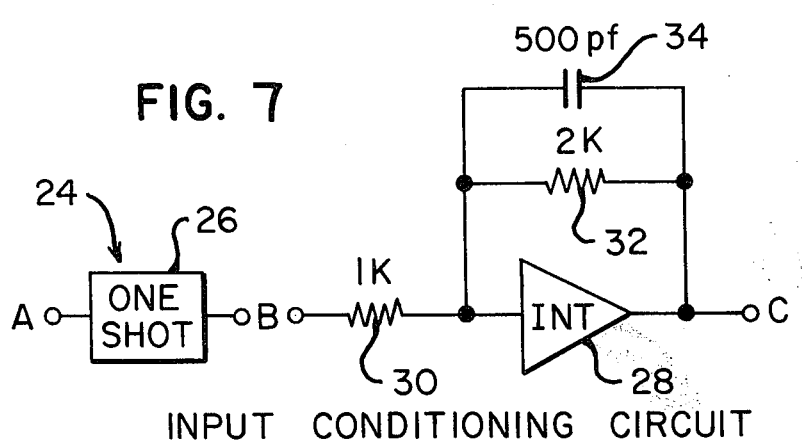
FIG. 7 is a general schematic diagram of an input conditioning circuit which may be used with the circuit shown in FIG. 1 when it is used as a frequency multiplier.

The input conditioning circuit 24 shown in FIG. 7 may be conventional and includes a one shot multi-vibrator 26, like type 74123 manufactured by Signetics Corporation, whose output B (shown in FIG. 8) is connected to the input of a conventional integrator 28 (like an operational amplifier) by a series resistor 30, which in the embodiment shown in 1K ohms. A resistor 32 (2K ohms) and a capacitor 34 (500 pf), connected in parallel across the terminals of the integrator 28, slow up the rise and fall times of the input pulse (shown as A in FIG. 8). The output of the multi-vibrator 26 is shown as approximately −5 volts with a pulse width of 10 microseconds. The integrator 28 inverts the −5 volts (B) to a positive input of about 10 volts to terminal C (FIG. 1) and slows up the rise and fall times of the input pulse A (FIG. 8) as mentioned.

Figure 5:
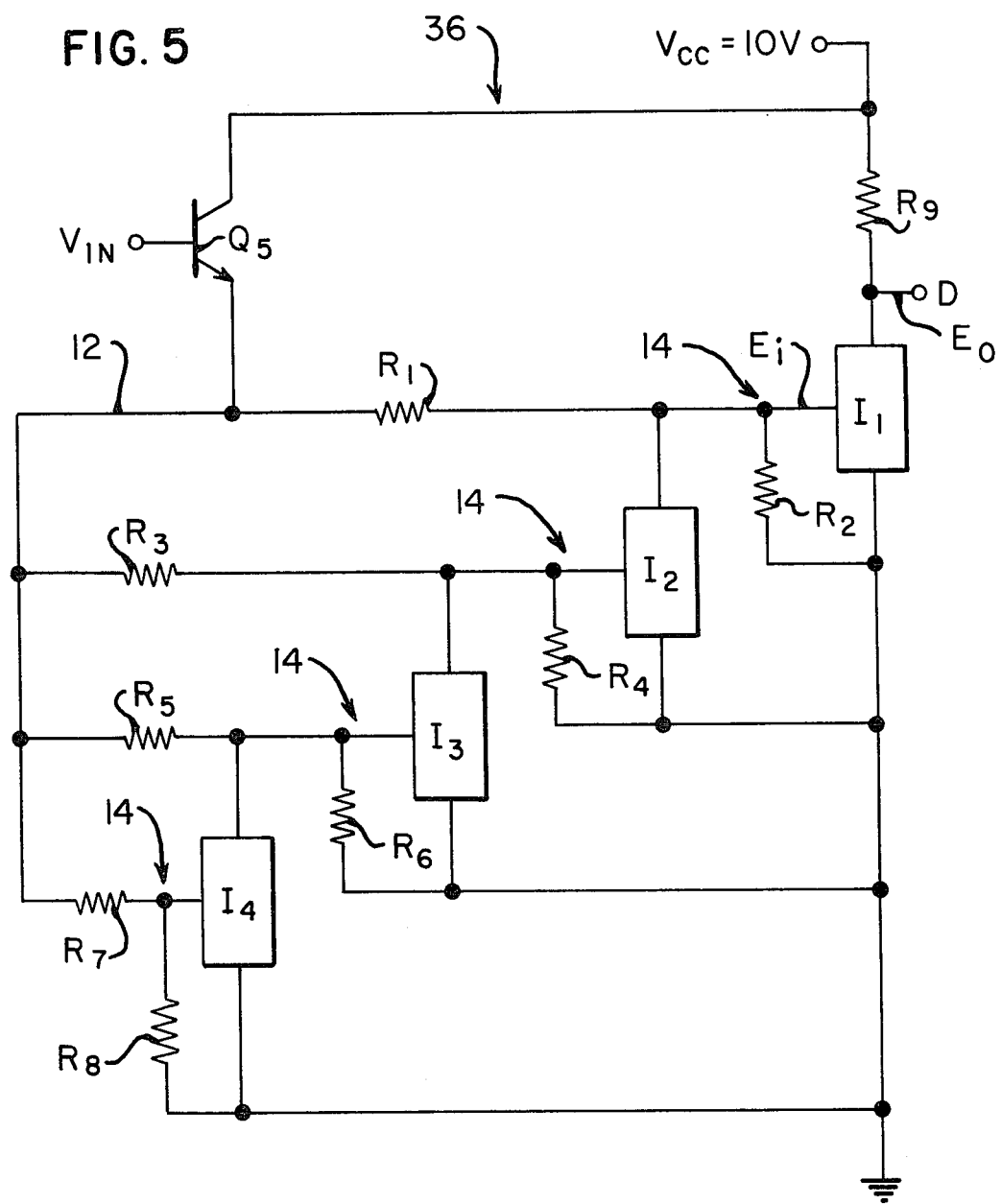
FIG. 5 is a general schematic diagram of a second embodiment of this invention which utilizes operational amplifiers as the switching means.

FIG. 5 is a general schematic diagram of a circuit designated generally as 36 of a second embodiment of this invention which utilizes operational amplifiers as the switching or inverting means in the circuit. The circuit 36 is the same as circuit 10 in FIG. 1 except for the fact that operational amplifiers $I_1$, $I_2$, $I_3$ and $I_4$ are used in place of transistors $Q_1$, $Q_2$, $Q_3$ and $Q_4$, respectively, and the values of resistors $R_1$ through $R_9$ are changed to accommodate the operational amplifiers. $V_o$ in FIG. 6 represents the threshold offset voltage which is the difference in voltage at the two inputs to the operational amplifier like $I_1$ for example, which is required to bring the output voltage $E_o$ to zero. The various threshold voltages $V_1$, $V_2$, $V_3$ and $V_4$ (FIG. 2) for the circuit 36 (FIG. 5) are determined by Equation #1 cited earlier herein, except that the offset voltage for the operational amplifier like $I_1$ is substituted for $V_o$ in Equation #1. Each operational amplifier like $I_1$ has the negative or inverting input like $E_i$ connected to the junction point of the associated resistors like $R_1$ and $R_2$ as shown in FIG. 5, while the non-inverting or positive input is connected to ground as shown. The output $E_o$ of operational amplifier $I_1$ is connected to the output terminal D of the circuit 36, and similarly, each output of the remaining operational amplifiers $I_1$, $I_2$ and $I_3$ is connected to the negative or inverting input of the respective preceding operational amplifier.

The operation of the circuit 36 (FIG. 5) is the same as that already described in relation to the circuit 10. For example, when the input pulse $V_{in}$ reaches the threshold voltage $V_1$, the output $E_o$ of amplifier $I_1$ will go from 10 volts to approximately zero volts, and when the input pulse $V_{in}$ reaches threshold voltage $V_2$, the output of amplifier $I_2$ will go to zero volts, thereby causing the output $E_o$ of amplifier $I_1$ to go to 10 volts. The remaining aspects of the operation of the circuit 36 are the same as that already described in relation to circuit 10.

As an illustration of the specific values used in circuit 36 in FIG. 5, the operational amplifiers are type 741 manufactured by Fairchild Semiconductor Corporation, and the following chart indicates the values of the various resistors used therein:

$R_1$ = 12K ohms,
$R_2$ = 1K ohms,
$R_3$ = 32K ohms,
$R_4$ = 1K ohms,
$R_5$ = 52K ohms,
$R_6$ = 1K ohms,
$R_7$ = 72K ohms,
$R_8$ = 1K ohms,
$R_9$ = 10K ohms,
$V_o$ = 0.1 volt;
$V_{BE}$ = 0.7 volt.

The above resistor values yield the same threshold transition points shown in FIG. 3.

The same input conditioning circuit 24 shown in FIG. 7 may be used with the circuit 36 for the same purposes already described. In general, higher precision can be achieved with the use of operational amplifiers $I_1$, $I_2$ etc. in circuit 36 than with transistors $Q_1$, $Q_2$ etc. in circuit 10.

While NPN transistors are shown in the embodiment 10 in FIG. 1, PNP transistors can be employed with proper biasing according to the principles disclosed herein. Also, in situations where speed of operation is not critical and the voltage levels of the input signal $V_{in}$ vary over a suitably large range, relays with their associated contacts may be substituted for the switching means shown in FIGS. 1 and 5.

What is claimed is:

1. A circuit comprising:
   a plurality of circuit means with a first one of said circuit means and the remaining one or ones thereof being interconnected in successive stages, with each said circuit means being capable of assuming first and second states in response to predetermined values of an input pulse;
   means for supplying an input pulse to each of said circuit means; and
   means interconnecting said plurality of circuit means for producing a number of output pulses at said first one of said circuit means, which said number of output pulses is dependent upon the number of said plurality of circuit means which have assumed said first state in response to said input pulse whereby said interconnecting means enable the second or any subsequent one of said circuit means, when assuming said first state, to cause the preceding said circuit means to assume said second state.

2. A circuit comprising:
   a plurality of switching means with each said switching means being switchable between first and second states; a first one of said switching means and the remaining one or ones thereof being interconnected in successive stages;
   means for supplying an input pulse to each of said switching means to enable each said switching means to switch to said first state in response to predetermined values of said input pulse; and
   means interconnecting said switching means so that when a second or any subsequent one of said switching means in said successive stages is switched to said first state in response to said input pulse, said second or any subsequent one of said switching means causes the preceding said switching means to switch to said second state, thereby producing a number of output pulses at said first one of said switching means, which number of output pulses is dependent upon the number of said switching means which have been switched into said first state in response to said input pulse.

3. The circuit as claimed in claim 2 in which each said switching means is switched to said first state at said predetermined values which are selected to enable said apparatus to be used as a level detector for said input pulse.

4. The circuit as claimed in claim 2 in which each said switching means is switched to said first state at said predetermined values which are selected to enable said apparatus to be used as a frequency multiplier.

5. A circuit comprising:
   a plurality of switching means with a first one of said switching means and the remaining one or ones of said plurality of switching means being interconnected in successive stages;
   thresholding means for each said switching means to switch the associated switching means respectively between first and second states in response to threshold values above and below the threshold value of the associated thresholding means;
   means for supplying an input pulse to each of said thresholding means; and
   output means connected to said first one of said switching means;
   said plurality of switching means being interconnected in said successive stages so that when the second or any subsequent one of said switching means is switched to said first state in response to said input pulse, said second or any subsequent one of said switching means affects the associated thresholding means of the preceding switching means, causing said preceding switch means to switch to said second state;
   said first one of said switching means producing a number of output pulses on said output means, which said number of output pulses is dependent upon the number of said switching means which have been switched into said first state.

6. The circuit as claimed in claim 5 in which said threshold values of the individual thresholding means are chosen to enable said apparatus to be used as a level detector.

7. The circuit as claimed in claim 5 in which said plurality of switching means contains a number of switching means equal to n and in which the number of output pulses produced at said output means is equal to n for each input pulse to enable said apparatus to be used as a frequency multiplier.

8. The circuit as claimed in claim 5 in which each said thresholding means comprises a voltage divider means.

9. The circuit as claimed in claim 5 in which each said switching means comprises a transistor having its emitter connected to a common ground,
   said output means being connected to the collector of the associated transistor of said first one of said switching means, and the collector of the associated transistor of said second or any subsequent one of said switching means being connected to the base of the associated transistor of the preceding said switching means.

10. The circuit as claimed in claim 9 in which each said thresholding means comprises a voltage divider means having first and second resistors connected in series, with the junction of the first and second resistors being connected to the base of the associated said transistor, and with the remaining end of said first resistor being connected to said supplying means, and with the remaining end of the second resistor being connected to said common ground.

11. The circuit as claimed in claim 10 in which each said first and second resistors of each said voltage divider means are selected to be in a predetermined ratio to each other.

12. The circuit as claimed in claim 5 in which said supplying means comprises an input conditioning means to slow up the rise and fall times of said input pulse.

13. The circuit as claimed in claim 5 in which each said switching means comprises an operational amplifier.

14. The circuit as claimed in claim 13 in which each said thresholding means comprises a voltage divider means having first and second resistors connected in series, with the junction of the first and second resistors being connected to the inverting input of the associated said operational amplifier, and with the remaining end of said first resistor being connected to said supplying means, and with the remaining end of said second resistor being connected to a common ground; said output means being connected to the output of the associated operational amplifier of said first one of said switching means; and the output of the associated operational amplifier of said second or any subsequent ones of said switching means being connected to the inverting input of the preceding said switching means; and
   the non-inverting input of each of the associated operational amplifiers of said plurality of switching means being connected to said common ground.

15. A method of producing a number of output pulses which is correlated to an input pulse comprising the steps of:
   (a) providing multiple stages of switching means;
   (b) providing said input pulse to each said stage;
   (c) interconnecting said stages in succession so that each said stage is switched from a second state into a first state in response to a predetermined level of said input pulse, and the second and subsequent stages, when switched into said first state, being effective to switch the immediately preceding stage into said second state; and
   (d) sampling the output of the first stage to provide a number of output pulses which is dependent upon the number of said stages which have been switched into said first state.

16. A method for multiplying a given frequency, comprising the steps of:
   (a) providing multiple stages of switching means, with the number of stages being equal to the frequency multiplication factor;
   (b) interconnecting said stages so that each preceding stage assumes a switching condition opposite from that of the stage which immediately succeeds it, when said succeeding stage is switched;
   (c) applying an input signal to the input of each said stage of a changing value to cause the switching means of successive stages to be switched from one switching condition to another; and
   (d) sampling the output of the first stage to provide output signals at a frequency equal to the input signal frequency multiplied by the number of stages.

17. A method for detecting voltage levels, comprising the steps of:
   (a) providing multiple stages of switching means;
   (b) interconnecting said stages so that each preceding stage assumes a switching condition opposite from that of the stage which immediately succeeds it, when said succeeding stage is switched;

(c) applying an input signal of a changing value to cause the switching means of successive stages to be switched from one switching condition to another, the number of stages switched being dependent upon the value of the input signal; and (d) sampling the output of the first stage to determine the number of output signals produced during the application of the input signal and thus ascertain the voltage level of the input signal.

* * * * *